(12) United States Patent
Batt (10) Patent No.: US 9,651,600 B2
(45) Date of Patent: May 16, 2017

(54) POWER UP DETECTING SYSTEM (71) Applicant: NANYA TECHNOLOGY CORP., Taoyuan (TW)

(72) Inventor: Wayne A. Batt, Boise, ID (US)

(73) Assignee: NANYA TECHNOLOGY CORP., New Taipei (TW)

( * ) Notice: Subject to any disclaimer, the term of this patent is extended or adjusted under 35 U.S.C. 154(b) by 0 days.

(21) Appl. No.: 14/951,508

(22) Filed: Nov. 25, 2015

(65) Prior Publication Data

US 2016/0077143 A1    Mar. 17, 2016

Related U.S. Application Data (62) Division of application No. 13/448,323, filed on Apr. 16, 2012, now Pat. No. 9,230,613.

(51) Int. Cl.
| | |
|---|---|
| *G01R 31/00* | (2006.01) |
| *G01R 31/02* | (2006.01) |
| *G01R 31/26* | (2014.01) |
| *G01R 31/40* | (2014.01) |
| *G11C 13/00* | (2006.01) |
| *G11C 7/00* | (2006.01) |
| *G11C 5/14* | (2006.01) |
| *G11C 29/12* | (2006.01) |
| *G01R 19/165* | (2006.01) |

(52) U.S. Cl.
CPC .......... *G01R 31/02* (2013.01); *G01R 19/165* (2013.01); *G11C 5/143* (2013.01); *G11C 5/148* (2013.01); *G11C 29/12005* (2013.01)

(58) Field of Classification Search
CPC ...... G01R 21/06; G01R 19/165; G01R 31/00; G01R 31/02; G01R 31/26; G01R 31/40; G11C 13/00; G11C 7/00
USPC .............................................. 324/76.11, 126
See application file for complete search history.

(56) References Cited

U.S. PATENT DOCUMENTS

| | | | |
|---|---|---|---|
| 4,837,505 | A | 6/1989 | Mitsunobu |
| 5,663,918 | A | 9/1997 | Javanifard |
| 6,714,031 | B2 | 3/2004 | Seki |
| 7,148,742 | B2 | 12/2006 | Pan |

(Continued)

FOREIGN PATENT DOCUMENTS

| | | |
|---|---|---|
| TW | 365005 | 7/1999 |
| TW | 201043973 | 12/2010 |
| TW | 201107761 | 3/2011 |

*Primary Examiner* — Son Le
*Assistant Examiner* — Neel Shah
(74) *Attorney, Agent, or Firm* — Winston Hsu; Scott Margo (57) ABSTRACT

A power up detecting system for generating one of a first power up detecting signal and a second power up detecting signal as the final power up detecting signal, according to power provided by a power supplier. The power up detecting system comprises: a power up detecting module, controlled by a control signal to generate the first power up detecting signal in a first mode and to generate the second power up detecting signal in a second mode, wherein a voltage level of the first power up detecting signal is transited when the power reaches a first predetermined voltage value, and the voltage level of the second power up detecting signal is transited when the power reaches a second predetermined voltage value; where the first predetermined voltage value is higher than the second predetermined voltage value.

3 Claims, 7 Drawing Sheets

(56) References Cited

U.S. PATENT DOCUMENTS

| | | | |
|---|---|---|---|
| 9,230,613 B2* | 1/2016 | Batt | G01R 31/02 324/132 |
| 2002/0033703 A1 | 3/2002 | Yu | |
| 2004/0263267 A1* | 12/2004 | Yin | G01R 23/15 331/74 |
| 2008/0157166 A1 | 7/2008 | Sim | |
| 2013/0234743 A1 | 9/2013 | Ren | |

* cited by examiner

POWER UP DETECTING SYSTEM

CROSS REFERENCE TO RELATED APPLICATIONS

This application is a division of U.S. application Ser. No. 13/448,323 filed Apr. 16, 2012, and incorporated herein by reference in its entirety.

BACKGROUND OF THE INVENTION

1. Field of the Invention

The present invention relates to a power up detecting system, and particularly relates to a power up detecting system having more than one trip points.

2. Description of the Prior Art

Figure 1:
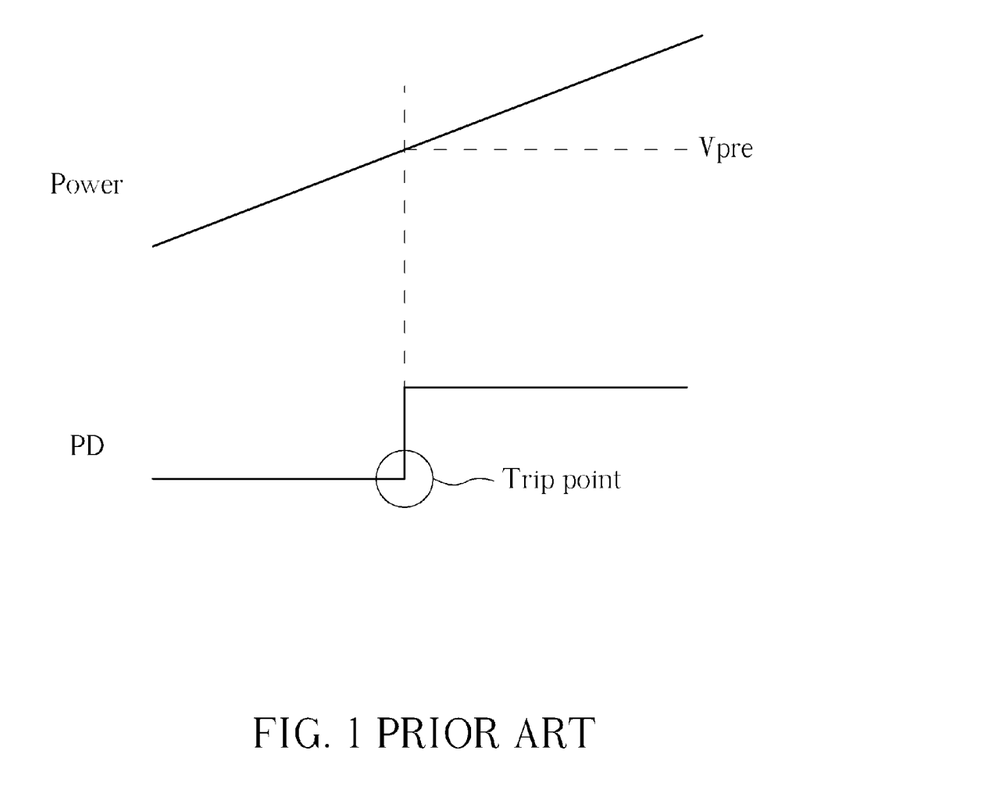
FIG. 1 is a schematic diagram illustrating the meaning of a trip point.

DRAM devices may have problems such as devices outputs logic values 0 or 1 when not intended during power supply ramp if the power up detecting circuit's trip point is set too low. The power up detecting circuit is utilized to detect the voltage value of the power provided by a power supplier, to generate a power up detecting signal PD. The trip point means the point that the power up detecting signal PD transits from a logic value 0 to a logic value 1 due to that the voltage value of the power up detecting signal PD reaches a predetermined voltage value Vpre, as shown FIG. 1.

Accordingly, if the trip point is set too low, logics of the circuitry may not correctly operate before the power up detecting signal PD trips. However, devices which run on an supply voltage than it ideally would, because the device must be able to function at much lower voltages in order to be tested for low voltage margin.

SUMMARY OF THE INVENTION

Therefore, one objective of the present invention is to provide a power up detecting system including more than one trip points.

One embodiment of the present application discloses a power up detecting system for generating one of a first power up detecting signal and a second power up detecting signal as the final power up detecting signal, according to power provided by a power supplier. The power up detecting system comprises: a power up detecting module, controlled by a control signal to generate the first power up detecting signal in a first mode and to generate the second power up detecting signal in a second mode, wherein a voltage level of the first power up detecting signal is transited when the power reaches a first predetermined voltage value, and the voltage level of the second power up detecting signal is transited when the power reaches a second predetermined voltage value; where the first predetermined voltage value is higher than the second predetermined voltage value.

In view of above mentioned embodiments, the power up detecting system includes more than one trip points such that a suitable trip point can be selected corresponding to different situations. By this way, the above-mentioned trip point selecting issue can be solved.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 2:
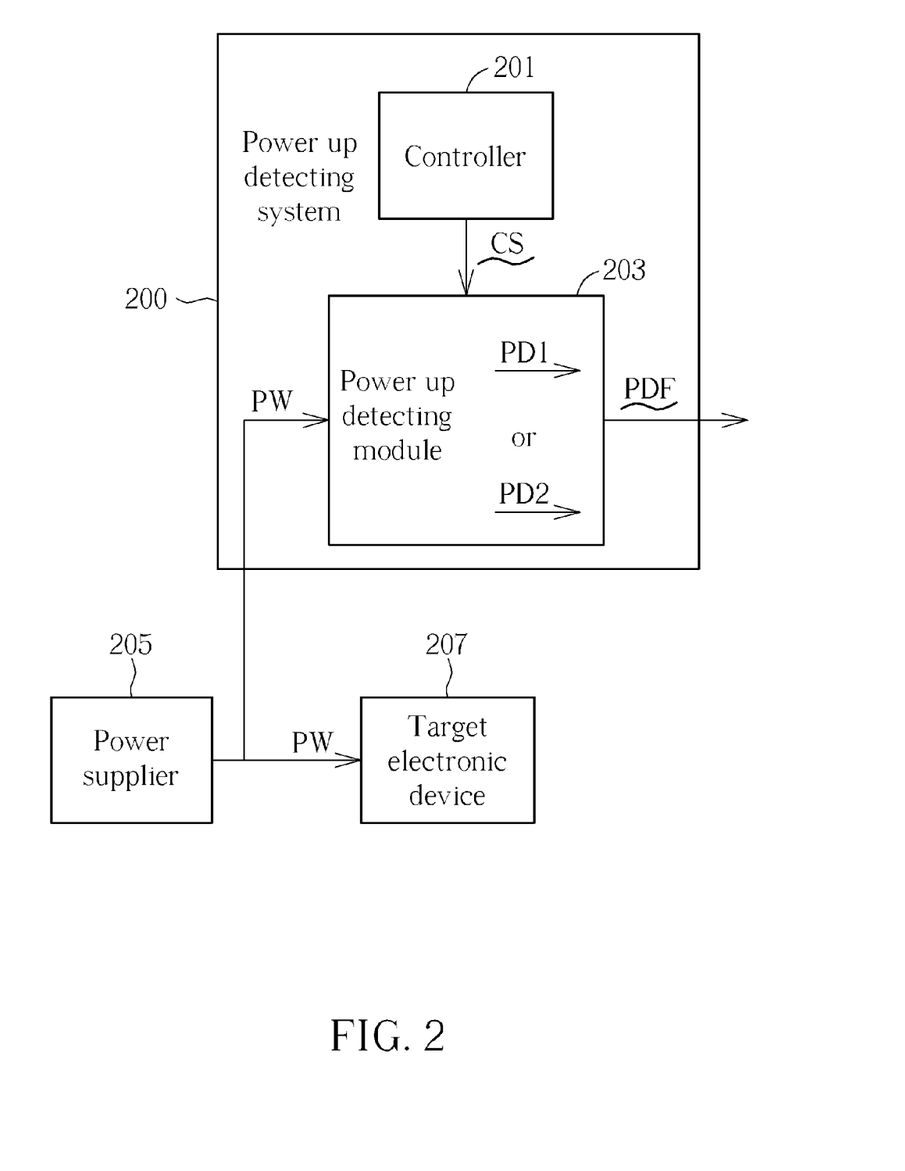
FIG. 2 is a block diagram illustrating a power up detecting system according to one embodiment of the present invention.

FIG. 2 is a block diagram illustrating a power up detecting system 200 according to one embodiment of the present invention. As shown in FIG. 2, the power up detecting system 200 generates one of a first power up detecting signal PD1 and a second power up detecting signal PD2 as the final power up detecting signal PDF, according to power PW provided by a power supplier 205. The power up detecting system 200 includes a power up detecting module 203 which is controlled by a control signal CS to generate the first power up detecting signal PD1 in a first mode and the second power up detecting signal PD2 in a second mode. The power up detecting module 203 utilizes a first trip point in the first mode and utilizes a second trip point in the second mode. The first trip point is higher than the second trip point.

Figure 3:
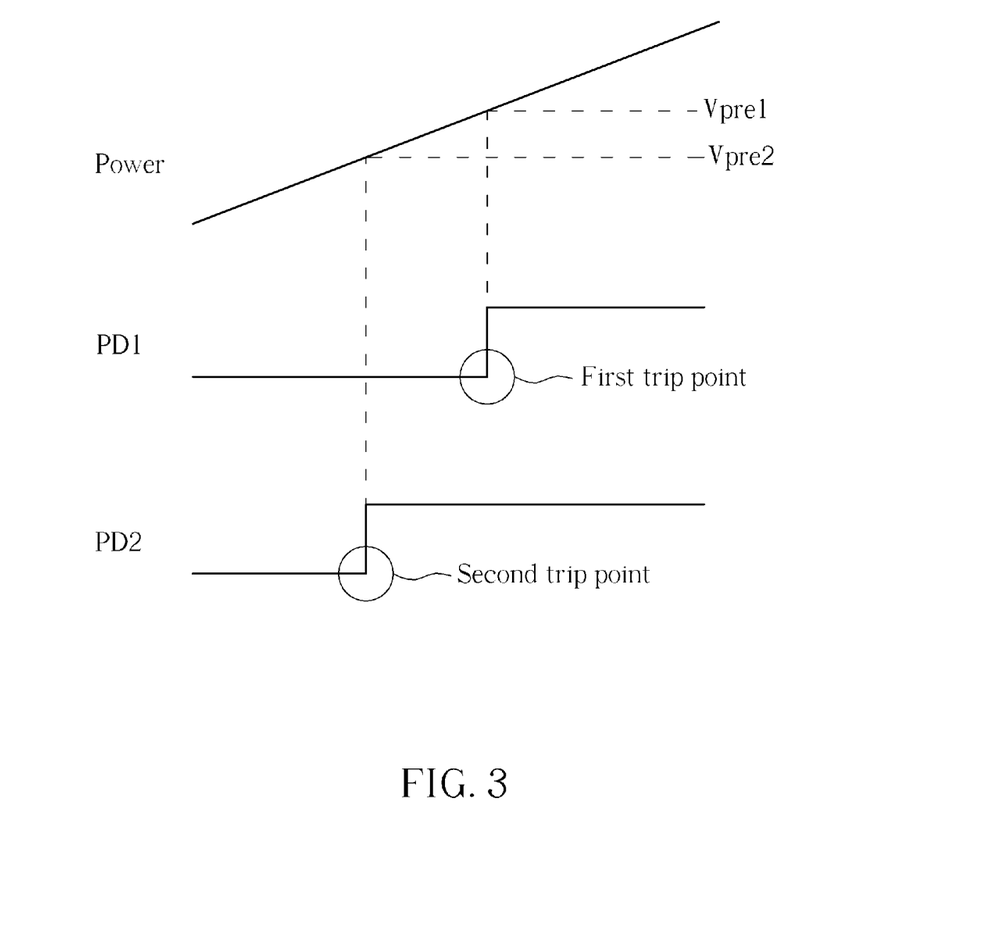
FIG. 3 is a schematic diagram illustrating the operation of the power up detecting system shown in FIG. 2.

FIG. 3 is a schematic diagram illustrating the operation of the power up detecting system shown in FIG. 2. As shown in FIG. 3, the voltage level of the first power up detecting signal PD1 is transited when the power reaches a first predetermined voltage value Vpe1, and the voltage level of the second power up detecting signal PD2 is transited when the power reaches a second predetermined voltage value Vpre2 lower than the first predetermined voltage value Vpe1. In the embodiment shown in FIG. 2, the control signal CS is generated by a controller 201 included in the power up detecting system 200, but it can also be generated by other devices.

In another embodiment, the power PW is utilized as operation power of the target electronic device 207. In this case, the first mode indicates the target electronic device 207 is in a normal mode and the second mode indicates the target electronic device is in a test mode 207. Therefore a suitable trip point can be selected corresponding to different situations. By this way, the above-mentioned issues about the selection of trip points can be solved.

Figure 4:
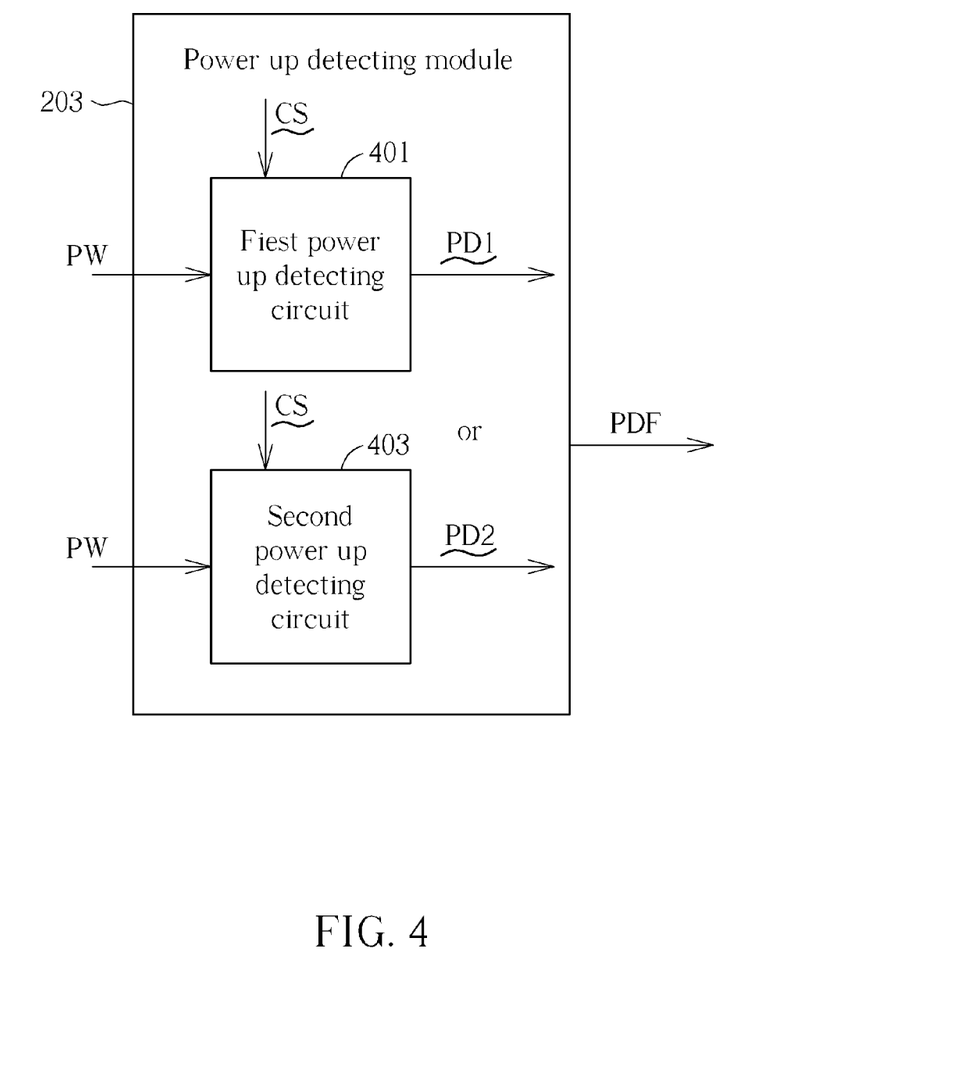
FIG. 4-FIG. 6 are block diagrams illustrating power up detecting systems according to other embodiments of the present invention.

FIG. 4 is a block diagram illustrating a power up detecting system according to another embodiment of the present invention. Please note that some devices the same as which in FIG. 2 are omitted for brevity. In this embodiment, the power up detecting module 203 includes a first power up detecting circuit 401 and a second power up detecting circuit 403. The first power up detecting circuit 401 is controlled by the control signal CS to generate the first power up detecting signal PD1 in the first mode. The second power up detecting circuit 403 is controlled by the control signal CS to generate the second power up detecting signal PD2 in the second mode. That is, the first power up detecting signal PD1 and the second power up detecting signal PD2 can be generated via a single circuit or module, such as the embodiment shown in FIG. 2. Alternatively, the first power up detecting signal PD1 and the second power up detecting signal PD2 can be generated via independent circuits, such as the embodiment shown in FIG. 4.

Figure 5:
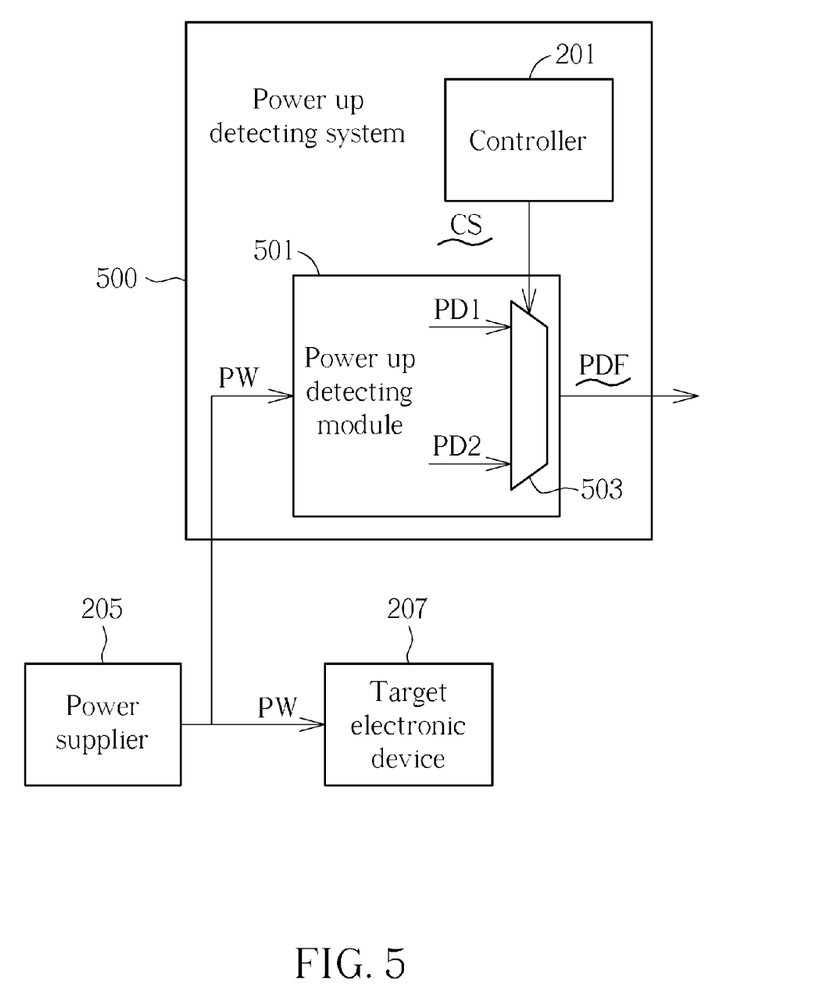

FIG. 5 is a block diagram illustrating a power up detecting system according to another embodiment of the present invention. In FIG. 5, the power detecting system 500 also includes a power detecting module 501. However, the power detecting module 501 simultaneously generates both the first power up detecting signal PD1 and the second power up detecting signal PD2 rather than only one of them. The power detecting module 501 includes a selector 503 for receiving the control signal CS to output one of the first power up detecting signal PD1 and the second power up detecting signal PD2 as the final power up detecting signal PDF. Other operations for the embodiment of FIG. 5 are the same as which of FIG. 2 and FIG. 4, thus are omitted for brevity here.

Figure 6:
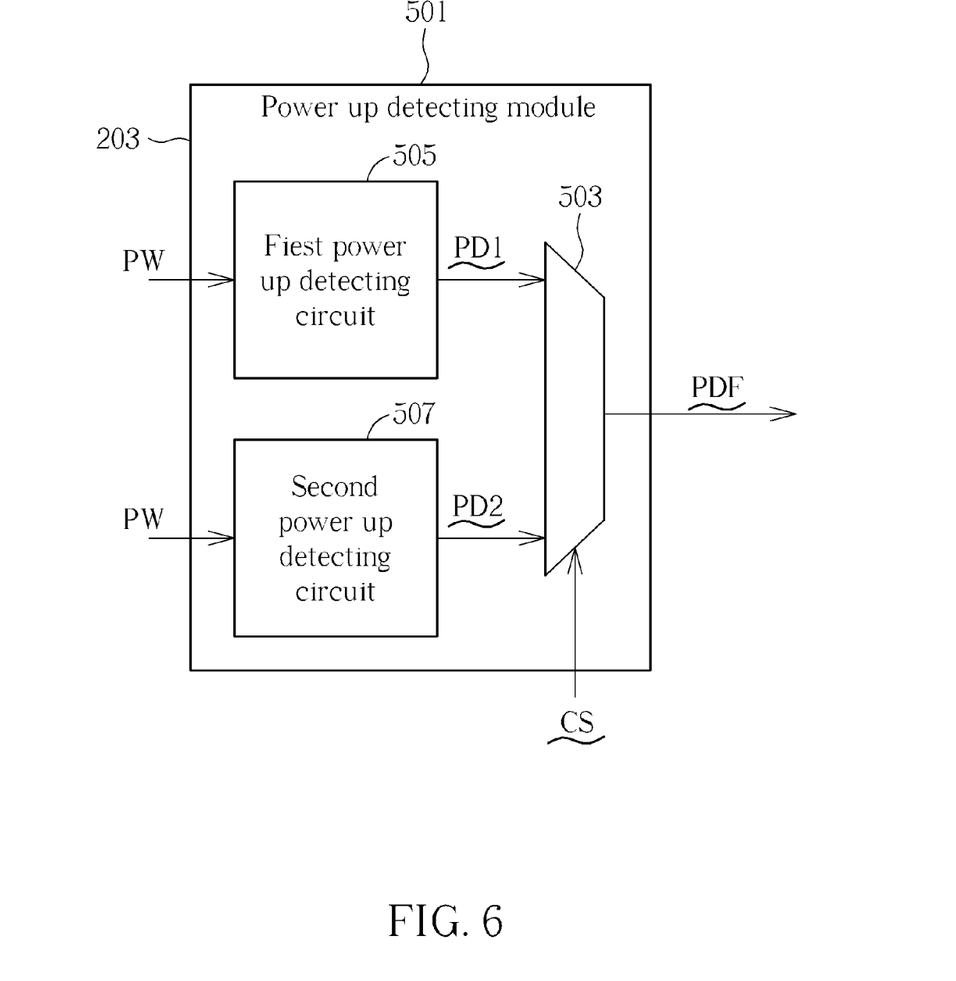

FIG. 6 is a block diagram illustrating a power up detecting system according to another embodiment of the present invention. Please note that some devices the same as which in FIG. 5 are omitted for brevity. As shown in FIG. 6, the power up detecting module 503 includes a first power up detecting circuit 505 and a second power up detecting circuit 507. The first power up detecting circuit 505 is utilized to generate the first power up detecting signal PD1 and simultaneously the second power up detecting circuit 403 is utilized to generate the second power up detecting signal PD2. That is, the first power up detecting signal PD1 and the second power up detecting signal PD2 can be generated via a single circuit or module, such as the embodiment shown in FIG. 5. Alternatively, the first power up detecting signal PD1 and the second power up detecting signal PD2 can be generated via different circuits, such as the embodiment shown in FIG. 6.

Figure 7:
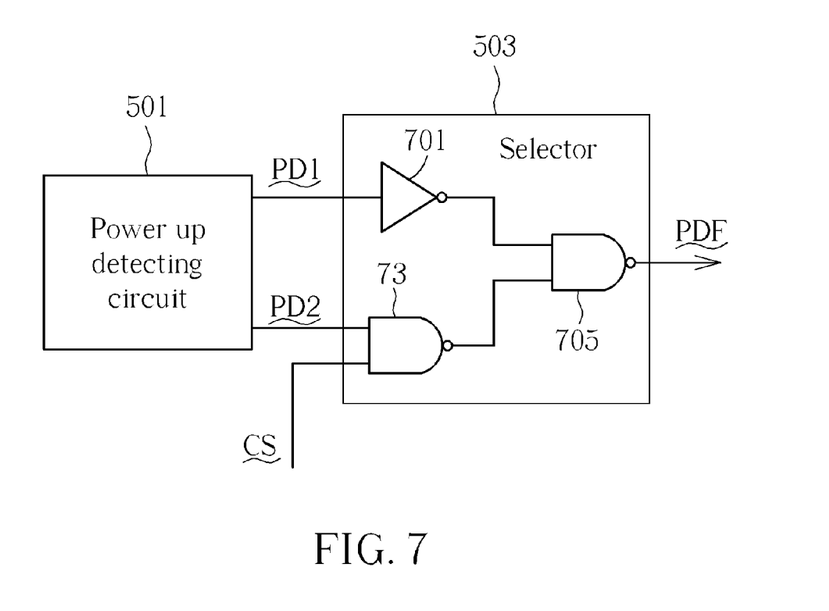
FIG. 7 is a circuit diagram illustrating detail structures of the selector in the embodiment shown in FIG. 5.

FIG. 7 is a circuit diagram illustrating detail structures of the selector in the embodiment shown in FIG. 5. Please refer to FIG. 7, the selector 503 includes a inverter 701, a first NAND gate 703 and a second NAND gate 705. The inverter 701 receives the first power up detecting signal PD1. The first NAND gate 703 receives the second power up detecting signal PD2 and the control signal CS. The second NAND gate 705 receives the outputs of the inverter 701 and the first NAND gate 703 to generate the final power up detecting signal PDF. Please note the selector 503 in FIG. 7 does not directly output the first power up detecting signal PD1 or the second power up detecting signal PD2 out, but utilizes the inverter 701, the first NAND gate 703 and the second NAND gate 705 to generate the final power up detecting signal PDF equivalent with the first power up detecting signal PD1 or the second power up detecting signal PD2, based on the first power up detecting signal PD1, the second power up detecting signal PD2 and the control signal CS.

Figure 8:
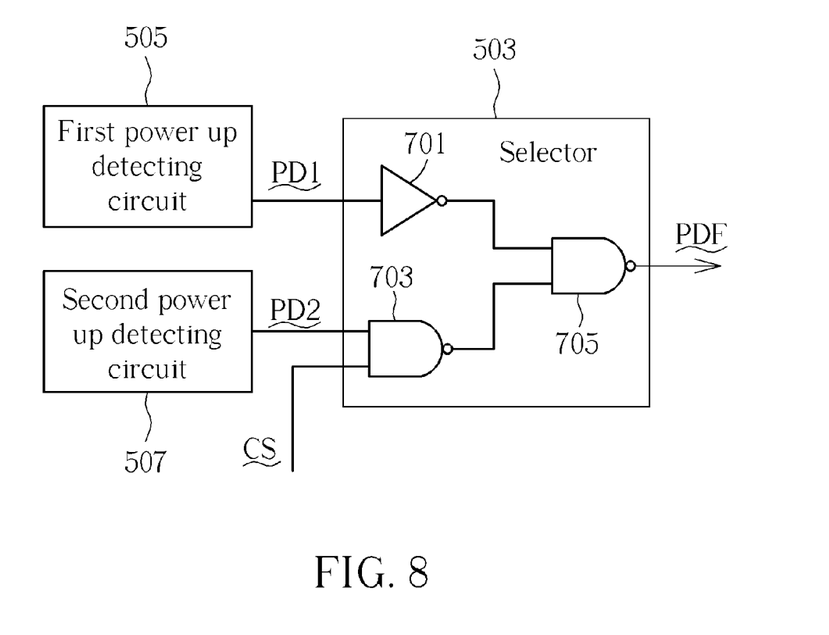
FIG. 8 is a circuit diagram illustrating detail structures of the selector in the embodiment shown in FIG. 6.

The structures for the selector 503 shown in FIG. 7 can also be applied to the embodiment of FIG. 6, as shown in FIG. 8. The operation of the circuit shown in FIG. 8 is the same as which of FIG. 7, thus it is omitted for brevity here.

In view of above mentioned embodiments, the power up detecting system includes more than one trip points such that a suitable trip point can be selected corresponding to different situations. By this way, the above-mentioned trip point selecting issue can be solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power up detecting system, for generating one of a first power up detecting signal and a second power up detecting signal as the final power up detecting signal, according to power provided by a power supplier, comprising:
   a power up detecting module, controlled by a control signal to generate the first power up detecting signal in a first mode and to generate the second power up detecting signal in a second mode, wherein the first power up detecting signal and the second power up detecting signal do not simultaneously exist;
   wherein the first power up detecting signal has a first logic value when the power is smaller than a first predetermined voltage value, and the first power up detecting signal has a second logic value when the power is equal to or larger than the first predetermined voltage value;
   wherein the second power up detecting signal has the first logic value when the power is smaller than a second predetermined voltage value, and the second power up detecting signal has a second logic value when the power is equal to or larger than the second predetermined voltage value;
   wherein the first predetermined voltage value is higher than the second predetermined voltage value.

2. The power up detecting system of claim 1, wherein the power is operation power of a target electronic device, where the first mode indicates the target electronic device is in a normal mode and the second mode indicates the target electronic device is in a test mode.

3. The power up detecting system of claim 1, wherein the power up detecting module includes:
   a first power up detecting circuit, controlled by the control signal to generate the first power up detecting signal in the first mode; and
   a second power up detecting circuit, controlled by the control signal to generate the second power up detecting signal in the second mode.

* * * * *